(12) United States Patent
Reddy et al.

(10) Patent No.: US 8,138,829 B2
(45) Date of Patent: Mar. 20, 2012

(54) SEGMENTED POWER AMPLIFIER WITH VARYING SEGMENT ACTIVATION

(75) Inventors: Vijay Kumar Reddy, Plano, TX (US);
Srikanth Krishnan, Richardson, TX (US); Brian P Ginsburg, Allen, TX (US); Srinath Mathur Ramaswamy, Murphy, TX (US); Chih-Ming Hung, Mckinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/789,342

(22) Filed: May 27, 2010

(65) Prior Publication Data

US 2011/0291754 A1  Dec. 1, 2011

(51) Int. Cl.
*H03F 1/14* (2006.01)

(52) U.S. Cl. .................... 330/51; 330/295; 330/124 R

(58) Field of Classification Search .............. 330/51, 330/295, 124 R, 278, 124 D
See application file for complete search history.

(56) References Cited

U.S. PATENT DOCUMENTS

| 6,819,171 | B2 * | 11/2004 | Kenington ............... 330/51 |
| 7,656,227 | B1 * | 2/2010 | Beaudoin et al. ............. 330/51 |

* cited by examiner

*Primary Examiner* — Hieu Nguyen
(74) *Attorney, Agent, or Firm* — Alan A. R. Cooper; Wade James Brady, III; Frederick J. Telecky, Jr.

(57) ABSTRACT

Various apparatuses and methods for varying segment activation in a segmented power amplifier are disclosed herein. For example, some embodiments provide a power amplifier including an input, an output, a plurality of amplifier segments and a controller. The amplifier segments are connected in parallel between the input and the output and are adapted to be activated and inactivated. The power level at the output may be controlled by changing a number of the amplifier segments that are activated concurrently. The controller is connected to the amplifier segments and is adapted to vary which of the amplifier segments are activated to arrive at a selected number of activated amplifier segments.

16 Claims, 3 Drawing Sheets

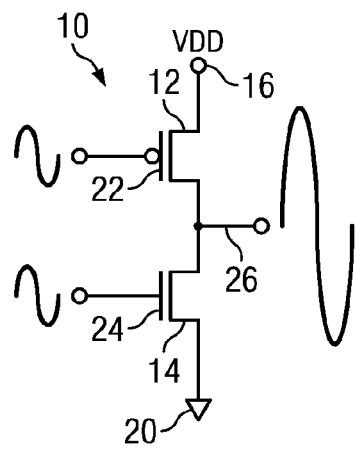
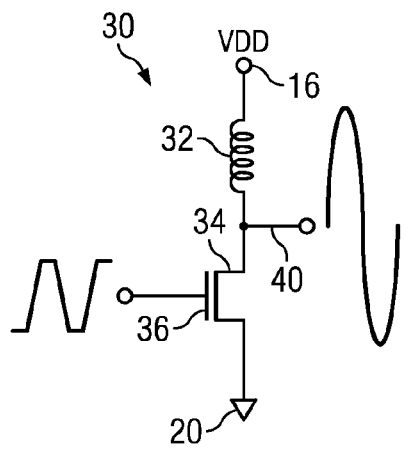
FIG. 1
FIG. 2
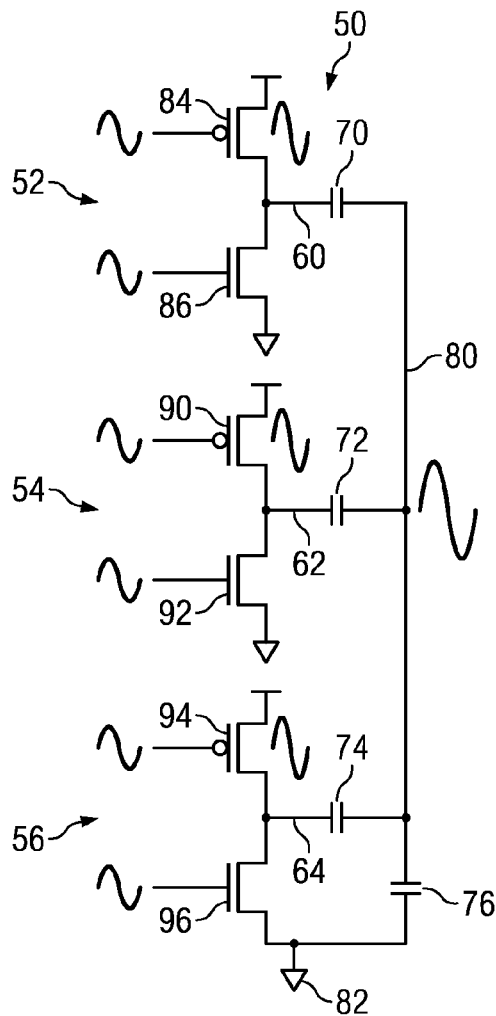
FIG. 3

SEGMENTED POWER AMPLIFIER WITH VARYING SEGMENT ACTIVATION

BACKGROUND

Electronic devices typically produce electrical signals that are driven by transistors or other types of switches. The power that can be driven by transistors in these signals is limited, and various techniques are used to increase power in an electronic device. One of these techniques is to divide an amplifier generating a high power signal into a number of segments. The outputs of the amplifier segments are combined to increase the overall output power in the signal. Thus, multiple segments in a segmented amplifier work in tandem to generate an electrical signal at a higher power than a single amplifier working alone.

In some systems, segmented amplifiers are designed to produce variable output power by activating a selected subset of the amplifier segments. To generate a full power signal, all amplifier segments are activated, but if less than full power is needed, some of the amplifier segments are activated and others are not. This type of selective activation can lead to unequal degradation of the transistors in the amplifier segments over the lifetime of the transistors, causing mismatches between segments. For example, when the drains of deep sub-micron CMOS transistors experience large signal swings as is often the case in amplifier transistors, they can experience hot-carrier induced parametric degradation and oxide breakdown. When some amplifier segments are used much more frequently than other segments, transistors in the most used segments are degraded faster than transistors in the least used segments. The resulting mismatch between transistors in segmented amplifiers can cause phase shifts between outputs and much lower total output power due to individual load mismatch.

SUMMARY

Various apparatuses and methods for varying segment activation in a segmented power amplifier are disclosed herein. For example, some embodiments provide a power amplifier including an input, an output, a plurality of amplifier segments and a controller. The amplifier segments are connected in parallel between the input and the output and are adapted to be activated and inactivated. The power level at the output may be controlled by changing a number of the amplifier segments that are activated concurrently. The controller is connected to the amplifier segments and is adapted to vary which of the amplifier segments are activated to arrive at a selected number of activated amplifier segments. The controller can also control the amplifier impedance matching network while enabling/disabling the segmented amplifier.

In other instances of the aforementioned power amplifier, the controller includes a microcontroller and a plurality of switches connected to the microcontroller. Each of the switches is connected to one of the amplifier segments to activate and deactivate the amplifier segments.

In an embodiment of the power amplifier, the switches are transmission gates.

An embodiment of the power amplifier also includes a power detector connected between the output and the controller.

In an embodiment of the power amplifier, the controller is adapted to periodically vary which of the amplifier segments are activated.

In an embodiment of the power amplifier, the controller is adapted to change the bit positions of the amplifier segments in the bit numbering scheme.

In an embodiment of the power amplifier, the controller is adapted to vary an amplifier segment activation scheme for the amplifier segments upon transition from a standby condition to a startup condition in the power amplifier.

In an embodiment of the power amplifier, the amplifier segment activation scheme identifies which of the amplifier segments is activated for each output power level from the power amplifier.

In an embodiment of the power amplifier, the controller is adapted to monitor an output power level reported by the power detector and to vary which of the amplifier segments are activated when the output power level drops below a threshold level.

In an embodiment of the power amplifier, the controller is adapted to randomly select the amplifier segments to be activated to arrive at the selected number of activated amplifier segments.

In an embodiment of the power amplifier, the controller is adapted to randomly select the amplifier segments based on quantization noise in a number of samples taken from an analog to digital converter.

In an embodiment of the power amplifier, the controller also has a power level control input. The controller is adapted to change the number of the amplifier segments that are activated concurrently to adjust the power level at the output based on the power level control input.

In an embodiment of the power amplifier, the power amplifier comprises a radio frequency digital to analog converter.

In an embodiment of the power amplifier, the amplifier segments each comprise a P channel transistor and an N channel transistor connected in series between a power and a ground, with a node between the P channel transistor and the N channel transistor connected to the output.

In an embodiment of the power amplifier, the amplifier segments each comprise an inductor and an N channel transistor connected in series between a power and a ground, with a node between the inductor and the N channel transistor connected to the output. Another embodiment of the power amplifier segment comprise of an inductor and a P channel transistor connected in series between a power and a ground, with a node between the inductor and the P channel transistor connected to the output.

Other embodiments provide a method of varying segment activation in a segmented power amplifier. The method includes monitoring an output power level from the segmented power amplifier. The segmented power amplifier includes a plurality of amplifier segments connected in parallel. The method also includes determining a number of amplifier segments in the segmented power amplifier to activate to set the output power level at a desired level. The method also includes varying which of the amplifier segments are included in the number to be activated.

In an embodiment of the method, the amplifier segments included in the number to be activated are varied randomly.

In an embodiment of the method, the amplifier segments included in the number to be activated are varied when the output power level drops below a threshold level with respect to the desired level.

In an embodiment of the method, the varying comprises rotating bit positions of the plurality of output segments in a bit numbering scheme.

Other embodiments provide a power amplifier having a number of amplifier segments connected in parallel between an amplifier input and an amplifier output. A power level at the amplifier output may be controlled by changing the number of amplifier segments that are activated concurrently. A power detector is connected to the amplifier output. A controller is connected to the amplifier segments. The controller includes a plurality of transmission gates, each connected to one of the plurality of amplifier segments. The controller also includes a microcontroller connected to the plurality of transmission gates. The controller has a detected power input connected to the power detector. The controller also has a power level control input. The controller is adapted to activate a number of the amplifier segments to adjust a power level at the output based on the power level control input. The controller is also adapted to randomly select which of the amplifier segments is included in the activated number upon transition from a standby condition to a startup condition in the power amplifier.

This summary provides only a general outline of some particular embodiments. Many other objects, features, advantages and other embodiments will become more fully apparent from the following detailed description, the appended claims and the accompanying drawings.

BRIEF DESCRIPTION OF THE DRAWINGS

A further understanding of the various embodiments may be realized by reference to the figures which are described in remaining portions of the specification. In the figures, like reference numerals may be used throughout several drawings to refer to similar components.

FIG. 1 depicts an example of an amplifier segment that may be used in a segmented power amplifier with varying segment activation.

FIG. 2 depicts an example of an amplifier segment that may be used in a segmented power amplifier with varying segment activation.

FIG. 3 depicts an example of a segmented power amplifier.

DESCRIPTION

Figure 4:
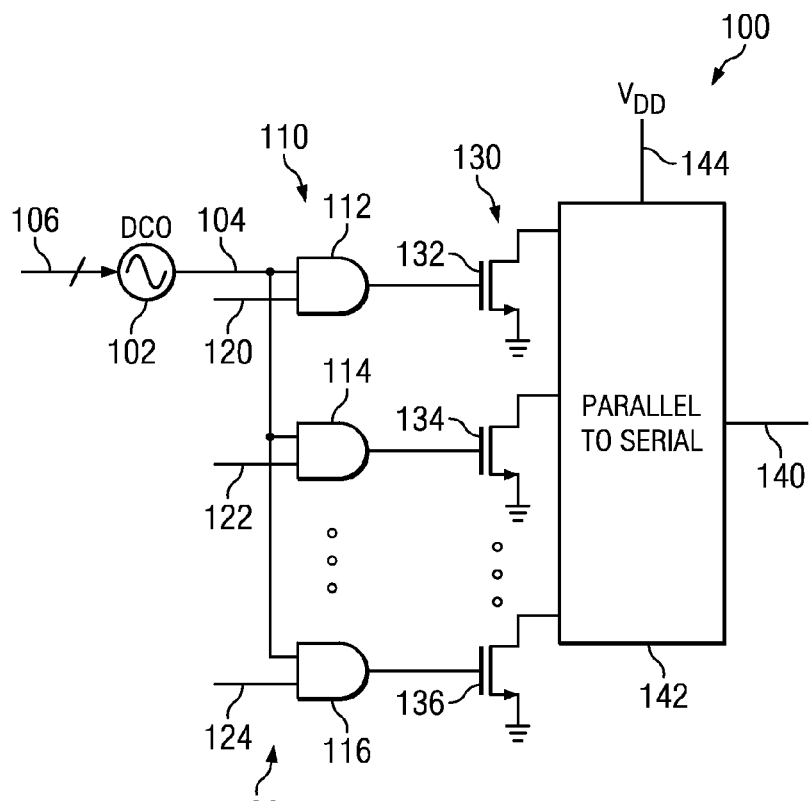
FIG. 4 depicts an example of a segmented power amplifier as embodied in an RF DAC.

The drawings and description, in general, disclose various embodiments of a segmented power amplifier with varying segment activation, and methods of varying the activation of segments in a segmented power amplifier. The term segmented power amplifier is used herein to refer to any electronic device that uses multiple amplifier segments to concurrently and cumulatively generate an output signal. In some embodiments, an amplifier segment comprises a driver. The term power is used herein in a generic fashion to refer to the strength of an output signal, and may be measured as voltage times current or as voltage or current alone or in other ways.

An example of one type of amplifier segment 10 that may be used in a segmented power amplifier is illustrated in FIG. 1. A pair of switches such as a PFET transistor 12 and an NFET transistor 14 are connected in series between a voltage supply 16 and ground 20. An input signal is connected to the gates 22 and 24 of the transistors 12 and 14. For example, the input signal may be a frequency modulated signal being driven to an antenna. The input signal may be biased and scaled suitably for the gates 22 and 24 transistors 12 and 14. The output 26 appears at a node between and at the drains of the PFET transistor 12 and NFET transistor 14.

An example of another type of amplifier segment 30 that may be used in a segmented power amplifier is illustrated in FIG. 2. An inductor 32 is connected in series between a voltage supply 16 and ground 20 with a switch such as an NFET transistor 34. An input signal is connected to the gate 36 of the NFET transistor 34. The output 40 appears at the node between the inductor 32 and the drain of the NFET transistor 34. The inductor 32 adds some filtering to the amplifier segment 30, reducing harmonic content in the output signal.

Amplifier segments 10 and 30 such as those used in on-chip pre-power amplifiers are typically driven to very large signal amplitudes to generate high output power. In both types of amplifier segment 10 and 30, the voltage swing at the output nodes 26 and 40 can be greater than the voltage at the voltage supply 16 or the rated technology voltage due to capacitive and inductive reactance in the systems. Such large drain voltage swings cause problems in transistors due to a number of reliability factors, particularly in deep sub-micron complementary metal-oxide semiconductor (CMOS) technology. High drain voltages can cause hot carrier injection, injecting electrons or holes into the gate dielectric. This causes interface states and oxide traps that can increase the threshold voltage $V_T$ of the device, degrade the subthreshold slope, and reduce the transistor drive strength thus changing the operating characteristics of the transistor. High drain voltages when the gates are at low voltage can cause drain stress in thin dielectric transistors which also reduces reliability. High gate bias voltages also cause stress leading to reliability problems, including positive bias temperature instability (PBTI) and negative bias temperature instability (NBTI), which degrades the gate oxide and changes the threshold voltage. Generally, the result of hot carrier injection, drain stress, PBTI and NBTI is a reduction in output power.

An example of a segmented power amplifier 50 is illustrated in FIG. 3. In this example, the segmented power amplifier 50 includes three parallel amplifier segments 52, 54 and 56, each being a dual-transistor amplifier as in FIG. 1. A matching network is connected to the amplifier segment outputs 60, 62 and 64 and may be used to tune an inductive antenna connected to the segmented power amplifier 50. The matching network includes series capacitors 70, 72 and 74 connected to the amplifier segment outputs 60, 62 and 64, and a shunt capacitor 76 connected between the overall output 80 and ground 82. Each amplifier segment 52, 54 and 56 may be activated or inactivated to control the power level at the output 80. The same input signal is typically provided at the gates 84, 86, 90, 92, 94 and 96 of the amplifier segments 52, 54 and 56, although biased as needed for the PFET and NFET transistors. Each active amplifier segment 52, 54 and 56 processes the same signal concurrently and is expected to produce the same output signal at the same time, contributing to the greater signal at the output 80.

The amplifier segments 52, 54 and 56 may be activated and inactivated in any suitable manner. For example, transmission gates may be placed at the gates 84, 86, 90, 92, 94 and 96 of the amplifier segments 52, 54 and 56 to either pass or block the input signals. Whatever the manner by which amplifier segments 52, 54 and 56 are activated and inactivated, unequal operation of the amplifier segments 52, 54 and 56 causes unequal degradation due to the reliability factors discussed above. For example, if the first amplifier segment 52 is always active during operation, the second amplifier segment 54 is active most of the time during operation, and the third amplifier segment 56 is active infrequently, most often producing something less than the maximum possible power at the output 80, the first amplifier segment 52 will be degraded most rapidly, followed by the second amplifier segment 54 and then the third amplifier segment 56.

When all the amplifier segments 52, 54 and 56 are exactly in phase, all the voltages at the amplifier segment outputs 60, 62 and 64 will be at the same voltage and therefore the segmented power amplifier 50 can be seen as a single large amplifier. If amplifier segments 52 and 54 are degraded over time, the current that they inject into the output 80 are different than that injected by amplifier segment 56. When all the amplifier segments 52, 54 and 56 are balanced, the transformed load impedance is a real impedance. For example, if the segmented power amplifier 50 is driving an inductive antenna, and that inductive load is transformed to the amplifier segment outputs 60, 62 and 64 through the shunt and series capacitors 76, 70, 72 and 74 in the matching network, the result is a real impedance with each amplifier segment 52, 54 and 56 being matched.

The unequal degradation of transistors in the amplifier segments 52, 54 and 56 causes a load mismatch. The design is optimized for delivering power to a real impedance load, but amplifier segment degradation causes an imbalance in the output current through each amplifier segment 52, 54 and 56, resulting in individual segments having a capacitive or inductive load component as well as a real load. If some amplifier segments 52 and 54 have degraded more than another 56, the degraded amplifier segments 52 and 54 inject less current into the output 80 than the other 56. Instead of driving the series capacitors 70, 72 and 74 in parallel, this causes a phase shift across the series capacitors 70, 72 and 74. The transformed load appears inductive for the stronger amplifier segments 56 and capacitive for the weaker amplifier segments 52 and 54. The stronger amplifier segment 56 sees a much larger voltage swing at the output 64 so it saturates earlier, and the weaker amplifier segments 52 and 54 see much less voltage swing and don't contribute as much. This may also cause the stronger amplifier segment 56 to be nonlinear because it has too large a voltage swing at the amplifier segment output 64 when compensating for the weaker amplifier segments 52 and 54 to produce the desired power at the output 80.

A similar problem arises for segmented RF power amplifiers such as in a class E pre-power amplifier or a radio frequency digital-to-analog converter (RF DAC) 100 as illustrated in FIG. 4. The RF DAC 100 includes a digitally controlled oscillator (DCO) 102 which produces a variable frequency signal at the output 104 based on a digital frequency control word 106. The variable frequency signal at the output 104 of the DCO 102 is gated by an array 110 of control gates (e.g., 112, 114 and 116). The array 110 of control gates (e.g., 112, 114 and 116) is operated by control signals (e.g., 120, 122 and 124) to either pass or block the variable frequency signal at the DCO output 104 from an array 130 of switches (e.g., 132, 134 and 136). The control signals (e.g., 120, 122 and 124) to the array 110 of control gates (e.g., 112, 114 and 116) may be viewed as bits in a gain control word 138. The frequency at the output 140 of the RF DAC 100 is thus controlled by the frequency control word 106, and the amplitude is controlled by the gain control word 138. The RF DAC 100 is not limited to any particular number of bits, and for example may include 256 bits or switches (e.g., 132, 134 and 136). The array 130 of switches (e.g., 132, 134 and 136) may comprise, for example, NFET transistors which are activated and inactivated by the control gate array 110. A parallel to serial converter 142 combines the output of each of the array 130 of switches (e.g., 132, 134 and 136) to produce the signal at the output 140 of the RF DAC 100. For example, a simple view of the contents of the parallel to serial converter 142 is similar to the amplifier segment 30 of FIG. 2, in which the drain of each switch (e.g., 132, 134 and 136) is connected to the output 140, and one or more inductors is connected between the output 140 and power 144.

When the gain control word 138 is set to request a low amplitude at the output 140, some of the switches (e.g., 132, 134 and 136) will be inactivated, causing unequal degradation. Typically, the array 130 of switches (e.g., 132, 134 and 136) is arranged according to a bit numbering scheme, with bit positions ranging from a least significant bit (LSB) (e.g., 136) to a most significant bit (MSB) (e.g., 132). The LSB 136 is active most of the time, whenever the gain control word 138 turns on any signal at all in the output 140. The MSB 132 is active only when the gain control word 138 has requested full power. The amount of time each of the array 130 of switches (e.g., 132, 134 and 136) is active thus decreases from LSB 136 to MSB 132, causing switches in the least significant bit positions to degrade sooner than switches in the most significant bit positions. This unequal degradation adds an additional concern in this case as the least significant bit switches are degraded sooner and become weaker. The RF DAC 100 is typically designed to have a linear range of output strengths, with the output amplitude increasing linearly as the value of the gain control word 138 is changed. As switches are degraded, the output 140 becomes nonlinear, so the signal at the output 140 not only loses power but is distorted from the desired function.

Figure 5:
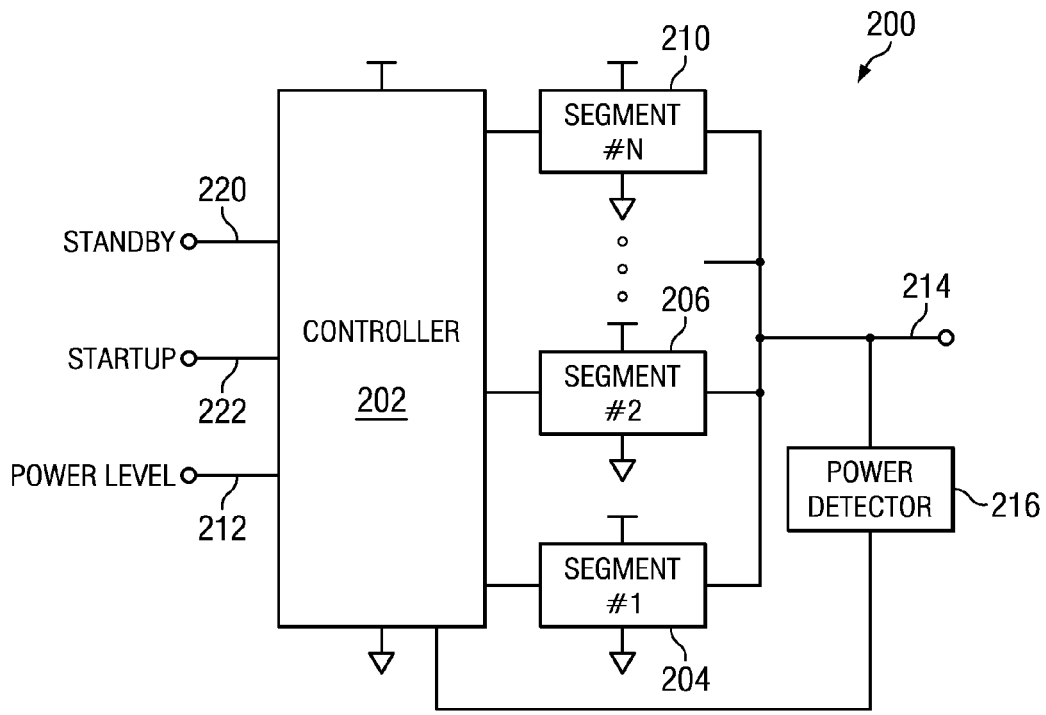
FIG. 5 is a block diagram of a segmented power amplifier with varying segment activation.

A segmented power amplifier 200 with varying segment activation which prevents or minimizes unequal degradation of amplifier segments is illustrated in FIG. 5. The segmented power amplifier 200 disclosed herein may be used in any suitable device, such as the segmented power amplifier 50 of FIG. 3, the RF DAC 100 of FIG. 4, or other types of segmented devices. The segmented power amplifier 200 includes a controller 202 that is connected to the amplifier segments 204, 206 and 210 to vary their activation and thereby distribute transistor degradation more uniformly across the amplifier segments. In some embodiments, the controller 202 has a power level control input 212 that indicates to the controller 202 how much power is required at the output 214. The controller 202 determines on the basis of the power level control input 212 how many amplifier segments (e.g., 204, 206 and 210) should be activated to generate the requested amount of power at the output 214. The controller 202 then randomly activates the needed number of amplifier segments to avoid activating the same amplifier segments each time. In other embodiments, the amplifier segment activation is varied according to non-random distribution schemes, such as by rotating through the amplifier segments sequentially.

The segmented power amplifier 200 includes a power detector 216 providing feedback to the controller 202 about the power level at the output 214. The controller 202 compares the actual power at the output 214 with the power requested on the power level control input 212 and activates the appropriate number of amplifier segments (e.g., 204, 206 and 210) to provide the requested power. The controller 202 may be adapted to activate enough amplifier segments to provide at least the requested power, or may be adapted to activate the number of amplifier segments that will provide the output power level that is closest to the requested power even if under the requested power.

In other embodiments, the controller 202 may have an input indicating a number of amplifier segments to be activated, rather than having a power level control input 212 and power detector. In this case, the controller 202 bases the number of amplifier segments to be activated on the control input, rather than on a request for a particular amount of output power and an output power feedback signal.

The activation of amplifier segments may be adapted to perform a number of different mitigation plans. In one mitigation plan, the amplifier segment activation is periodically cycled at the end of a predetermined time period, such as every few seconds or every few hours of operation. Again, the amplifier segments to be activated may be randomly selected or rotated in some other manner, while keeping the appropriate number of amplifier segments activated.

In another mitigation plan, in which amplifier segments are organized by bit position, the amplifier segments are rotated within a bit numbering scheme. For example, all amplifier segments but the most significant bit may be rotated up into the next higher bit position, and the amplifier segment that was the most significant bit is assigned as the least significant bit. The rotation may be performed on a timed basis, such as once an hour during operation, or each time the system is turned on, or each time the power level is changed in the controller 202 by a changing value on the power level control input 212, etc.

In another mitigation plan, the controller 202 includes a standby input 220 and a startup input 222. The standby input 220 is asserted when the segmented power amplifier 200 is disabled, the startup input 222 is asserted to enable the segmented power amplifier 200. In this mitigation plan, the amplifier segment activation is randomly cycled upon a transition from a standby state to a startup state, triggered by the gate 22 and the startup input 222. This mitigation plan is particularly useful when activating amplifier segments and deactivating other amplifier segments causes undesirable effects during operation. For example, if the segmented power amplifier 200 is used in an FM transmitter, changing the activated amplifier segments during operation can lead to an audible click. Thus, the amplifier segments to be activated for each possible discrete number of activated amplifier segments are determined at startup when the system is initially tuned.

In another mitigation plan, the controller 202 monitors the power at the output 214 as reported by the power detector 216 and changes the activated amplifier segments only when the output power has changed with respect to the power requested at the power level control input 212. This may be accomplished by comparing the power at the output 214 with a reference signal and changing the activated amplifier segments when the power at the output 214 drops below a threshold power level. In this case, a different threshold level may be established for each possible discrete number of activated amplifier segments, or a power difference may be established and used as the acceptable difference between the actual output power and the requested power level. Thus, as transistors in amplifier segments are degraded and their output power drops, the controller 202 will activate other amplifier segments in their place to equalize the degradation across all amplifier segments.

Figure 6:
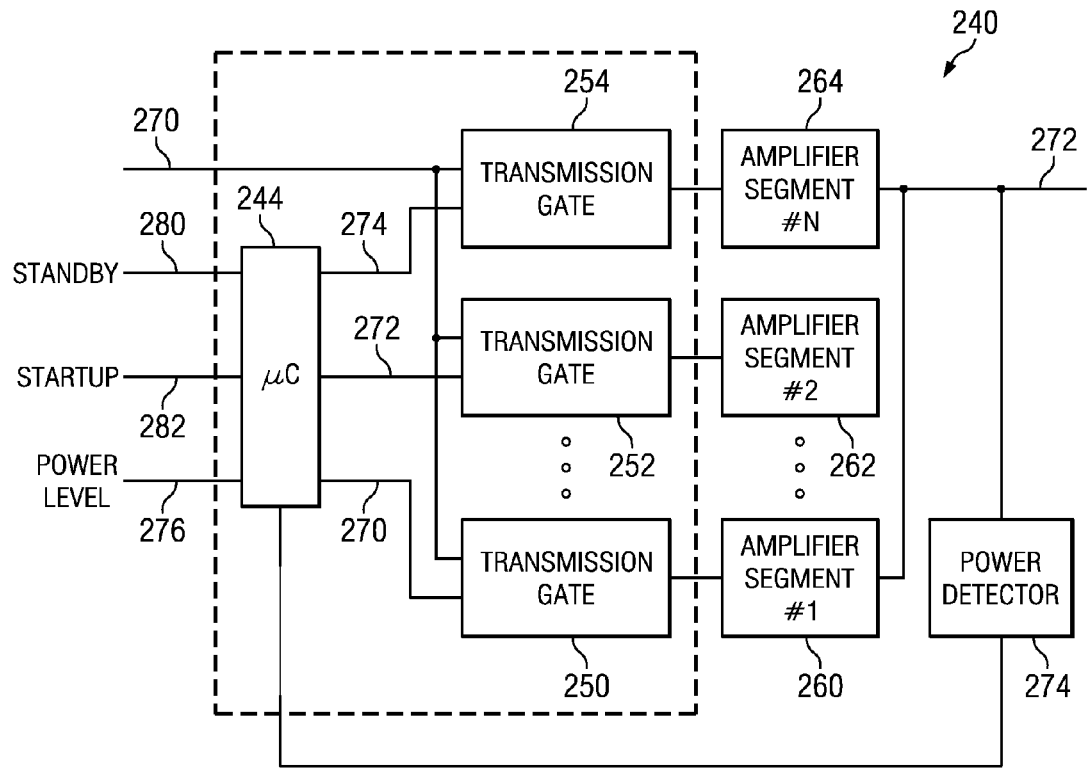
FIG. 6 is a block diagram of a segmented power amplifier with varying segment activation, with an example of a microcontroller-based controller.

The controller 202 may be embodied in a variety of ways, including using logic gates, state machines, etc. In one embodiment illustrated in FIG. 6, a segmented power amplifier 240 includes a controller 242 having a microcontroller 244 using transmission gates 250, 252 and 254 to activate amplifier segments 260, 262 and 264. For example, each transmission gate 250, 252 and 254 may include an NFET transistor and a PFET transistor connected in parallel, with the gates of the transistors connected to control signals 270, 272 and 274 from the microcontroller 244. When the microcontroller 244 turns on a transmission gate (e.g., 250), the input signal 270 is allowed to pass through the transmission gate 250 to the corresponding amplifier segment 264. The microcontroller 244 executes firmware or software in the system to implement one or more of the mitigation plans discussed above, for example monitoring the power at the output 272 using a power detector 274 and varying the amplifier segment activation if the output power drops a predetermined amount below the power level requested by the power level control input 276. In another example, the microcontroller 244 may vary the amplifier segment activation when the system transitions from a standby state to a startup state as triggered by a standby input 280 and a startup input 282.

In mitigation plans using a random selection of amplifier segments to be activated, any of a number of suitable techniques may be used as the basis for the randomization. For example, the microcontroller 244 may base the randomization on quantization noise in an analog to digital converter (ADC), such as sampling quantization noise in a sub-sampling Nyquist analog to digital converter or in a sigma-delta analog to digital converter. By taking several samples from the ADC, separated by a large number of cycles, there is enough entropy in the samples to use as the basis for randomly selecting different amplifier segments.

In some embodiments, the impedance of the matching network (including for example series capacitors 70, 72 and 74 connected to the amplifier segment outputs 60, 62 and 64, and shunt capacitor 76) can be adjusted while selecting and deselecting amplifier segments. Matching network tuning may be beneficial during this amplifier segment selection due to unequal transistor degradation, process variation in transistors or for other reasons. As different amplifier segments are activated, the impedance of the matching network naturally may change because portions of the matching network associated with the newly activated amplifier segments may have a different impedance than that of portions of the matching network associated with previously activated amplifier segments. The matching network impedance may be adjusted in any suitable manner. For example, in some embodiments some or all of the series capacitors 70, 72, and 74 and shunt capacitor 76 may comprise variable capacitors, each including a bank of capacitors that can be selectively switched in an out to vary the overall capacitance. In other embodiment, the matching network may include variable inductors.

Figure 7:
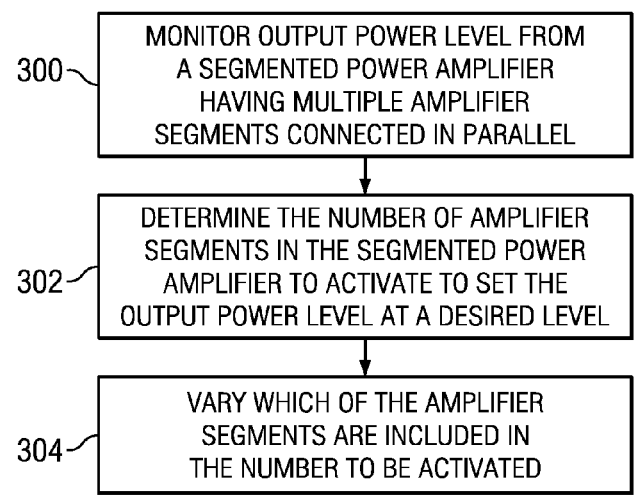
FIG. 7 depicts a flow chart of an example of a method for varying the segment activation in a segmented power amplifier.

An example of a method of varying segment activation in a segmented power amplifier is summarized in the flow chart of FIG. 7. The output power level from a segmented power amplifier having multiple amplifier segments connected in parallel is monitored. (Block 300) The number of amplifier segments that should be activated to set the output power level at a desired level is determined. (Block 302) The amplifier segments to be included in the number to be activated is varied, leveling the use of transistors in the amplifier segments and preventing unequal degradation. (Block 304) The amplifier segment activation may be varied according to one or more different mitigation plans, as discussed above. The method may be performed in circuits presented in the example embodiments discussed above or in other variations suitable for altering the activation of amplifier segments.

The various embodiments of a segmented power amplifier with varying segment activation, and the methods of varying the activation of segments in a segmented power amplifier disclosed herein, provide adaptive techniques to compensate for reliability degradation of transistors, maintaining linearity and output power levels without increases in transistor widths. The techniques disclosed herein are particularly beneficial for deep submicron CMOS technologies, but may be applied to other technologies.

While illustrative embodiments have been described in detail herein, it is to be understood that the concepts disclosed herein may be otherwise variously embodied and employed.

What is claimed is:

1. A power amplifier comprising:
   an input;
   an output;
   a plurality of amplifier segments connected in parallel between the input and the output, wherein the plurality of amplifier segments are adapted to be activated and inactivated, and wherein a power level at the output may be controlled by changing a number of the plurality of amplifier segments that are activated concurrently; and
   a controller connected to the plurality of amplifier segments, wherein the controller is adapted to vary which of the plurality of amplifier segments are activated to arrive at a selected number of activated amplifier segments,
   wherein the controller is adapted to randomly select the amplifier segments to be activated to arrive at the selected number of activated amplifier segments.

2. The power amplifier of claim 1, wherein the controller comprises a microcontroller and a plurality of switches connected to the microcontroller, each of the plurality of switches being connected to one of the plurality of amplifier segments to activate and deactivate the amplifier segments.

3. The power amplifier of claim 2, wherein the plurality of switches comprise a plurality of transmission gates.

4. The power amplifier of claim 1, further comprising a power detector connected between the output and the controller.

5. The power amplifier of claim 1, wherein the controller is adapted to vary an amplifier segment activation scheme for the plurality of amplifier segments upon transition from a standby condition to a startup condition in the power amplifier.

6. The power amplifier of claim 5, wherein the amplifier segment activation scheme identifies which of the plurality of amplifier segments is activated for each output power level from the power amplifier.

7. The power amplifier of claim 4, wherein the controller is adapted to monitor an output power level reported by the power detector and to vary which of the plurality of amplifier segments are activated when the output power level drops below a threshold level.

8. The power amplifier of claim 1, wherein the controller is adapted to randomly select the amplifier segments based on quantization noise in a plurality of samples taken from an analog to digital converter.

9. The power amplifier of claim 1, the controller further comprising a power level control input, wherein the controller is adapted to change the number of the plurality of amplifier segments that are activated concurrently to adjust the power level at the output based on the power level control input.

10. The power amplifier of claim 1, wherein the power amplifier comprises a radio frequency digital to analog converter.

11. The power amplifier of claim 1, wherein the plurality of amplifier segments each comprise a P channel transistor and an N channel transistor connected in series between a power and a ground, with a node between the P channel transistor and the N channel transistor connected to the output.

12. The power amplifier of claim 1, wherein the plurality of amplifier segments each comprise an inductor and an N channel transistor connected in series between a power and a ground, with a node between the inductor and the N channel transistor connected to the output.

13. A method of varying segment activation in a segmented power amplifier, the method comprising:
    monitoring an output power level from the segmented power amplifier, the segmented power amplifier comprising a plurality of amplifier segments connected in parallel;
    determining a number of amplifier segments in the segmented power amplifier to activate to set the output power level at a desired level; and
    varying which of the amplifier segments are included in the number to be activated,
    wherein said varying comprises rotating bit positions of the plurality of amplifier segments in a bit numbering scheme.

14. The method of claim 13, wherein the amplifier segments included in the number to be activated are varied randomly.

15. The method of claim 13, wherein the amplifier segments included in the number to be activated are varied when the output power level drops below a threshold level with respect to the desired level.

16. A power amplifier, comprising:
    a plurality of amplifier segments connected in parallel between an amplifier input and an amplifier output, wherein a power level at the amplifier output may be controlled by changing a number of the plurality of amplifier segments that are activated concurrently;
    a power detector connected to the amplifier output; and
    a controller connected to the plurality of amplifier segments, the controller comprising a plurality of transmission gates, each connected to one of the plurality of amplifier segments, the controller further comprising a microcontroller connected to the plurality of transmission gates, the controller having a detected power input connected to the power detector, the controller also having a power level control input, wherein the controller is adapted to activate a number of the amplifier segments to adjust a power level at the output based on the power level control input, wherein the controller is also adapted to randomly select which of the amplifier segments is included in the activated number upon transition from a standby condition to a startup condition in the power amplifier.

* * * * *